United States Patent [19]

Cromwell et al.

[11] 3,763,381

[45] Oct. 2, 1973

[54] THYRISTOR GATING AND PHASE SHIFT CIRCUIT

[75] Inventors: Gordon W. Cromwell; Walter G. Borland, both of Waterford, Pa.

[73] Assignee: Elgin Electronics, Inc., Waterford, Pa.

[22] Filed: Nov. 18, 1971

[21] Appl. No.: 199,915

[52] U.S. Cl. ......... 307/255, 307/252 N, 307/252 B, 307/293

[51] Int. Cl. ........................................... H03k 17/00

[58] Field of Search................ 307/293, 246, 252 N, 307/252 B, 255

[56] References Cited

UNITED STATES PATENTS

| | | | |
|---|---|---|---|
| 3,594,591 | 7/1971 | Laupman | 207/252 N |
| 3,450,891 | 6/1969 | Riley | 307/252 B |
| 3,436,562 | 4/1969 | Harris, Jr. | 307/252 B |
| 2,958,017 | 10/1960 | Hogue | 307/293 |

*Primary Examiner*—John W. Huckert
*Assistant Examiner*—B. P. Davis
*Attorney*—Joseph B. Balazs

[57] ABSTRACT

A circuit for developing a pulse output for phase control of thyristors and the like characterized in the utilization of a minimum number of components and a unique capacitor discharge circuit. Full wave control is achieved by the switching of a pair of complementary transistors in emitter coupled connection with a load impedance, receiving pulse forming power from the cyclical power source and a short time constant RC circuit, being switched by trigger signals developed from a silicon bilateral switch sensitive to the potential in an adjustable RC phase shift circuit. A further pair of complementary transistors and associated diodes perform discharge of the capacitor upon reversal of the applied voltage, being sensitive to the direction of charging current and the polarity of potential at the capacitor.

12 Claims, 2 Drawing Figures

THYRISTOR GATING AND PHASE SHIFT CIRCUIT

BACKGROUND OF THE INVENTION

Phase shift gating circuits are well established in the art, many utilizing the phase shift characteristics of an RC type charging circuit in which up to 180° of phase shift can be achieved and capable of a bidirectional or full wave mode of operation by duplication of components therein. The criterion of circuits of this type is the development of a suitable output pulse having a relatively rapid rise time and a controlled decay characteristic with suitable volt ampere production to achieve reliable triggering of thyristors and the like often including SCR devices. The disadvantage of most circuits of this type is the complexity of the circuit required. In order to achieve bidirectional or full wave operation and to accommodate voltage variations and extraneous noise signals and the like, additional components are required beyond the essential switching and voltage monitoring components which determine the phase angle for triggering and production of an appropriate output.

Inasmuch as charging circuits employing a capacitor are employed in many of these prior art arrangements regulation of the applied input voltage must be provided or assurances must be included that a stable and repeatable phase angle signal is produced. Most often this is performed by the cyclical discharge of the capacitor in the circuit at predetermined times within the cycle of the power source so as to achieve a suitable reference level of potential and circuit arrangements have become quite complex in achieving this function.

SUMMARY OF THE INVENTION

Therefore it is one object of this invention to provide an improved gating circuit especially suited for thyristor components and the like which utilizes a minimal number of components for development of a phase controlled pulse output.

It is another object of this invention to provide an improved thyristor gating circuit which generates phase shifted pulses in a reliable and repeatable manner in which synchronization with applied input voltage is assured by a novel capacitor discharge circuit.

It is yet another object of this invention to provide an improved capacitor discharge circuit especially suited for application in thyristor gating circuits.

It is a still further object of this invention to provide an improved capacitor discharge circuit which utilizes the minimal components of pairs of complementary transistors and associated diodes and which relies for operation on the reversal of charging current in the capacitor.

These objectives are achieved in the instant invention in a circuit arrangement including an adjustable resistor-capacitor charging circuit for achieving the development of a potential shifted in phase with respect to cyclically applied power, the desired switching level being determined by a silicon bilateral switch in a full wave arrangement and connected to control the discharge of a second capacitor into the load impedance by way of a pair of complementary transistors. A further pair of complementary transistors are in connection with the phase shift capacitor in a manner to obtain base-emitter biasing current by virtue of the charging current passing through the capacitor and acting as shunting elements by virtue of the collector-emitter path in a diode connected arrangement responsive to the potential appearing across the capacitor. Thus the characteristics of the circuit are entirely reversible, alternate half cycles of the power source being accommodated by the complementary transistors with synchronization being achieved with the power source on each half cycle.

Other objects and advantages of the present invention will become apparent as the following description proceeds.

To the accomplishment of the foregoing and related ends, the invention, then, comprises the features hereinafter fully described, the following description and the annexed drawing setting forth in detail a certain illustrative embodiment of the invention, this being indicative, however, of but one of the various ways in which the principles of the invention may be employed.

DESCRIPTION OF THE PREFERRED EMBODIMENT

Figure 1:
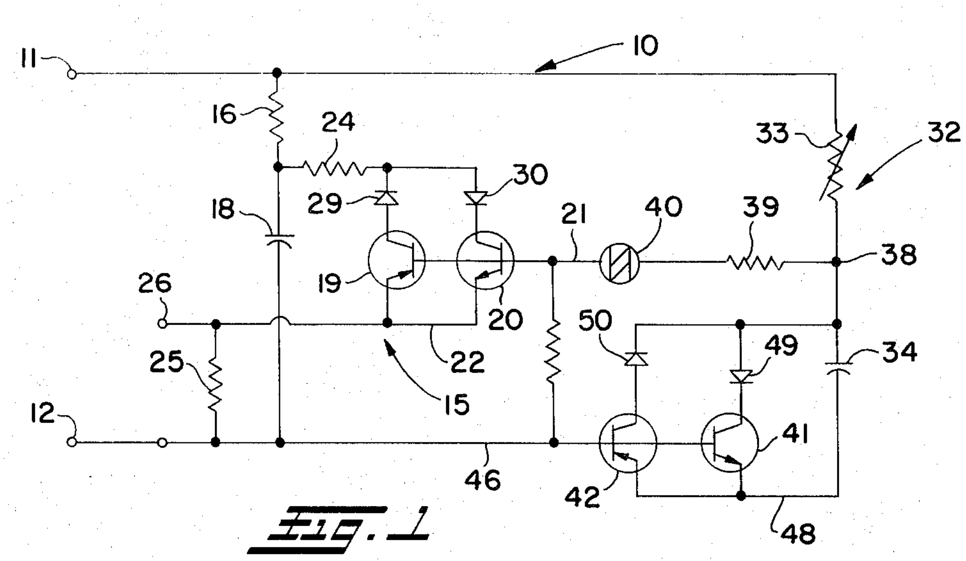
FIG. 1 is a scehmatic circuit diagram of a preferred embodiment of this invention suitable for full wave operation.
Figure 2:
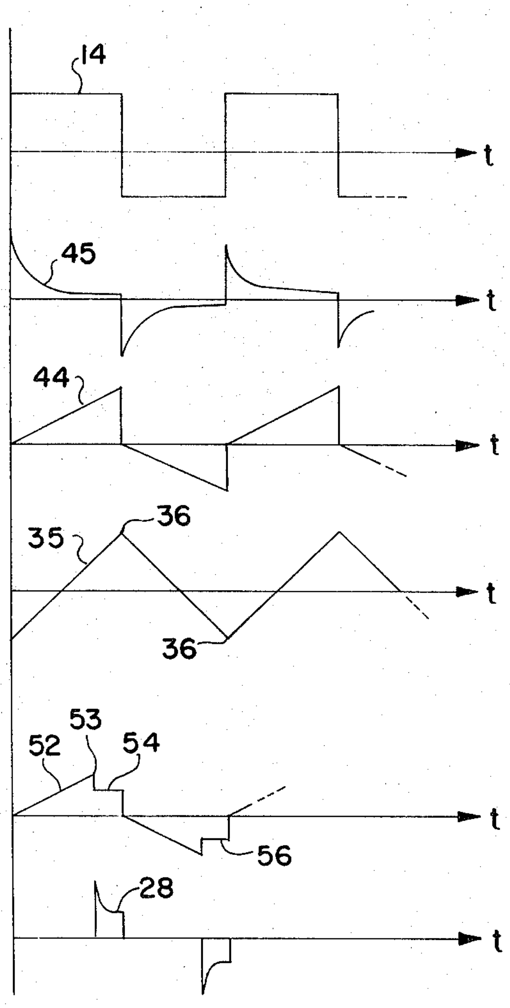
FIG. 2 is a graph of the various wave forms occurring in portions of the circuits of FIG. 1 over more than one cycle of the power source.

Referring now to the FIG. 1 showing of the preferred embodiment of the invention there is shown a full wave gating circuit 10 operable from a cyclical power source to produce gating signals on each half cycle of the power source. Input terminals 11, 12 receive voltage from the power source which is depicted in graph 14 of FIG. 2 as a square wave voltage varying between positive and negative levels so that during one-half of the cycle terminal 11 is positive with respect to terminal 12 and in the second half of the cylce terminal 12 is positive with respect to terminal 11. While a square wave voltage is indicated as the preferred form of power source, other wave shapes may be used although these may affect the amount of phase shift due to resetting partway through the half cycle.

The pulse forming circuit indicated generally at 15 is connected to the input terminals 11, 12, such circuit comprising in part the series connection of a low impedance resistor 16 typically on the order of 200 ohms and a capacitor 18 which may be on the order of 2 mfd. The time constant of such charging circuit is relatively short and thus the potential appearing across the capacitor 18 substantially follows the wave shape of the input voltage. The capacitor 18 thus supplies a source of charge for development of the pulse output and is advantageous in preventing rapid excursions of the input voltage from being applied directly to the pulse forming switching means to be described.

Such pulse forming means comprise complementary PNP and NPN transistors 19, 20 having base electrodes connected in common by way of line 21 and emitter electrodes connected in common by way of line 22, being in operative shunt connection with the capacitor 18 by way of a low impedance resistor 24 typically on the order of 22 ohms and the load impedance 25. Line 22 connects with one output terminal 26 for the circuit, the load impedance 25 which may be a resistor connected in the circuit or a current path formed by the load device external to the circuit is connected between such output terminal 26 and one terminal 12 receiving voltage from the power source, thereby to develop the pulse output depicted in graph 28 of FIG. 2.

The pulse forming circuit is completed by the diodes 29, 30 connected respectively between the collector electrodes of the PNP and NPN transistors 19, 20 and the resistor 24, such diodes being poled to present the proper biasing potential to the respective one of the transistors 19, 20 when the voltage across the capacitor 18 is of one polarity, the second diode at that time providing isolation for the second transistor. The voltage at the capacitor 18 reverses on each half cycle of the power source and the transistors 19, 20 are alternately biased for conduction and for development of an output pulse in the load impedance 25 upon receipt of a suitable base bias signal on line 21 forming the control electrode for the pulse forming circuit.

The phase shift function of the circuit is achieved in an RC charging circuit indicated generally at 32 comprising the series connection of an adjustable resistor 33 typically on the order of 8.2 K ohms and a capacitor 34 on the order of 2 mfd. The charging circuit 32 is operatively connected between the input terminals 11, 12 of the circuit and without more would typically produce the wave shape indicated in graph 35 of FIG. 2, achieving a maximum potential 36 of either polarity at the time of switching of the power source.

The junction 38 between the variable resistor 33 and the capacitor 34 is connected to the control electrode 21 of the pulse forming circuit by way of the series connection of a resistor 39 on the order of 100 ohms and a voltage responsive switching element 40 which preferably is a silicon bilateral switch. The switch 40 has an inherent voltage sensitive characteristic of either polarity and presents a high impedance connection until a predetermined voltage level is attained across the capacitor 34 at which level the device switches to a low impedance characteristic allowing discharge of the capacitor 34 through the base-emitter junction of one of the transistors 19, 20, such forward bias allowing conduction of that transistor via the collector-emitter path for development of a pulse output in the load impedance 25. Other forms of devices may be utilized in place of the silicon bilateral switch 40 including the trigger diac and the bidirectional diode thyristor and it will be evident that still other devices could be employed if only half cycle operation were desired. It is clear however that by adjustment of the impedance of the variable resistor 33, the charging rate of the capacitor 34 can be varied to alter the build up of potential thereacross and thus the time of triggering of the bilateral switch 40 as well as of the transistors 19, 20 with respect to the voltage cycle of the power source. While a series connection of adjustable resistor 33 and capacitor 34 is indicated as preferred, similar operation can be obtained by the shunt connection of an adjustable resistor across the capacitor 34 or by the substitution of a voltage controlled element in place of the adjustable resistor 33 in either variation, if a voltage controlled operation is desired.

Such described charging chracteristic is conventional and it will be apparent that the rate of charging of the capacitor 34 is a function also of the applied potential from the power source and that variations in the phase angle of the trigger pulse will occur for variations in the input voltage. It is desirable to limit these variations to occur within one-half cycle of the power source so as not to allow a cumulative effect and this function is obtained in this embodiment of the invention by the discharge of the capacitor 34 to a predetermined minimal level upon each reversal of the voltage of the power source, i.e. at the end of each half cycle of same. For this purpose complementary NPN and PNP transistors 41, 42 are employed in both the charging and discharging paths of the capacitor 34 to produce the voltage characteristic depicted in graph 44 of FIG. 2, the capacitor current being indicated in graph 45.

The base electrodes of these transistors 41, 42 are joined by line 46 connected in turn to one input terminal 12 of the circuit, the emitter electrodes being joined by line 48 connected in turn to one side of the capacitor 34. The collector electrodes of the transistors 41, 42 are connected by diodes 49, 50 respectively to the other side of the capacitor 34, this being the junction 38 between the variable resistor 33 and the capacitor 34. The diodes 49, 50 are poled to properly bias the appropriate one of the transistors 41, 42 for discharge current flow at one polarity of developed voltage across the capacitor 34 and to isolate the second transistor in this instance by virtue of the high impedance characteristic when reversely biased.

Thus it will be seen that the following type of operation occurs in the discharge circuit. When input terminal 11 of the circuit 10 is positive with respect to terminal 12 a charging circuit for the capacitor 34 will be established through the adjustable resistor 33, the capacitor 34 and the base-emitter path of the PNP transistor 42 allowing build up of the voltage across the capacitor 34 in a typical manner. Such operation is depicted in graph 52 of FIG. 2 and the build up of voltage will continue until a level 53 is reached where the silicon bilateral switch 40 becomes conductive to supply current to the pulse forming circuit. The capacitor 34 will discharge until the switch 40 again reverts to a high impedance state and will maintain substantially this level 54 until the end of the half cycle of the power source.

When terminal 12 of the circuit becomes more positive than terminal 11 a second charging path for the capacitor 34 will be established through the variable resistor 33, the capacitor 34 and the base-emitter junction of the NPN transistor 41, thereby forward biasing the latter for conduction. Since a positive potential appears across the capacitor 34 at this instant a discharge path through the diode 49 and the collector-emitter path of the NPN transistor 41 is established causing discharge of the capacitor 34 until a reverse potential appears thereacross and continued charging occurs in the reverse polarity. During discharge of the capacitor 34 the PNP transistor 42 is isolated therefrom by way of the diode 50 presenting a high impedance characteristic. On the next half cycle 56, a similar operation will obtain with a similar triggering of the silicon bilateral switch 40 and a subsequent discharge of the capacitor 34 now by way of the PNP transistor 42 and associated diode 50 by virtue of the forward charging current through the base-emitter junction of the PNP transistor 42 when reversal of the power source occurs.

Such discharging thus assures synchronization of the development of the output pulse with the voltage applied at terminals 11, 12, preventing a charge accumulation from affecting timing and offering a circuit with minimal components which provides a stable and reliable controllable phase-shifted pulse output.

The embodiments of the invention in which an exclusive property or privilege is claimed are defined as follows:

1. A phase control gating circuit for developing a pulse output in time relation to a cyclical power source comprising a charging circuit in operative shunt connection with said source of power for developing a gating potential, a pulse forming circuit including controlled switching means and a load impedance in operative shunt connection with said source of power for developing an output pulse across said load impedance upon actuation of said controlled switching means, the latter including a control electrode for actuating said controlled switching means in response to a trigger pulse, and a voltage responsive trigger element in operative connection with said control electrode and said charging circuit for developing such trigger pulse in each cycle of said power source when the potential in said charging circuit attains a predetermined level.

2. A circuit as set forth in claim 1 wherein said charging circuit comprises a capacitor and a variable impedance in connection therewith for varying the charging rate of said capacitor to adjust the time of development of the gating potential thereacross.

3. A circuit as set forth in claim 2 wherein said variable impedance is an adjustable resistor in series circuit connection with said capacitor.

4. A circuit as set forth in claim 1 wherein said controlled switching means comprises complementary transistors in parallel base and emitter connection and said voltage responsive trigger element is a silicon bilateral switch for developing trigger signals on each half cycle of said power source for full wave phase control.

5. A circuit as set forth in claim 1 further including means operatively connected with said charging circuit for discharging same in each cycle of said power source, said discharging means being responsive to initial current flow in said charging circuit and comprising a pair of control elements and a pair of current directing devices interconnected therewith for establishment of bidirectional current discharge paths.

6. A circuit as set forth in claim 5 wherein said pair of control elements comprise complementary transistors in parallel base and emitter connection and said pair of current directing means comprises diodes respectively connected to the collector electrodes of said transistors, said charging circuit including a capacitor therein in shunt connection with each said transistor and diode combination to establish current discharge through the collector-emitter paths of said transistors.

7. A circuit as set forth in claim 6 wherein said controlled switching means comprises complementary transistors in parallel base and emitter connection and said voltage responsive trigger element is a silicon bilateral switch for developing trigger signals on each half cycle of said power source, being operatively connected between the bases of said transistors and said capacitor.

8. Variable phase gating apparatus for thyristors and the like operative from a cyclical power source, comprising a pair of terminals adapted for receipt of voltage from said power source, a first circuit in connection with said terminals comprising first bidirectional switching means having a control electrode and a load impedance in series connection with said first switching means, a second circuit in connection with said terminals comprising a capacitor, current responsive switching means in connection with said capacitor for bidirectional discharge of said capacitor in response to reversal of current flow therethrough and means for controlling the charging rate of said capacitor, and a voltage responsive switching element in connection between said control electrode and said capacitor for energizing said bidirectional switching means to develop an output pulse in said load impedance when the voltage in said capacitor attains a predetermined level.

9. Apparatus as set forth in claim 8 wherein said current responsive switching means comprises NPN and PNP transistors having base electrodes connected to one of said pair of terminals and emitter electrodes connected to said capacitor, and a diode in connection between said capacitor and each collector electrode of said transistors.

10. Apparatus as set forth in claim 9 wherein said bidirectional switching means comprises NPN and PNP transistors having base electrodes connected in common as said control electrode and emitter electrodes connected in common to said load impedance, the collector electrodes of said transistors being connected by way of diodes to a second capacitor in a charging circuit.

11. A bidirectional discharge circuit for a capacitor in a phase shift gating circuit and the like energized from an alternating source of power and including means for controlling the charging rate of said capacitor, comprising NPN and PNP transistors having base electrodes connected in common and emitter electrodes connected in common, said emitter electrodes further being connected to one side of said capacitor to establish capacitor charging current circuits through one or the other of the base-emitter paths of said transistors dependent upon the polarity of said power source, a diode connected between each collector electrode of said transistors and the other side of said capacitor to establish capacitor discharge current circuits through one or the other of the collector-emitter paths of said transistors, said diodes being poled to isolate said transistors from reverse voltage, each said discharge circuit being operative in response to forward bias of the respective base-emitter path of said transistors due to charging current flow and potential occurring across said capacitor of a polarity to cause forward bias of the respective diode.

12. A circuit as set forth in claim 11 wherein one of said diodes has an anode connected to the collector of said PNP transistor and a cathode connected to said other side of said capacitor and the other of said diodes has a cathode connected to the collector of said NPN transistor and an anode connected to said other side of said capacitor.

* * * * *